(12) United States Patent
Mao

(10) Patent No.: US 6,169,671 B1
(45) Date of Patent: Jan. 2, 2001

(54) SNUBBER CIRCUIT FOR A POWER SWITCH AND RECITIFYING DIODE AND POWER CONVERTER EMPLOYING THE SAME

(75) Inventor: Hengchun Mao, Collin, TX (US)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/553,939

(22) Filed: Apr. 21, 2000

(51) Int. Cl.[7] .................................................. H02H 7/125
(52) U.S. Cl. ................................. 363/53; 363/126
(58) Field of Search ............................. 363/50, 52, 53, 363/125, 126

(56) References Cited

U.S. PATENT DOCUMENTS 5,874,826 * 2/1999 Chen et al. ..................... 363/53 X
5,923,547 7/1999 Mao .................................. 363/52

* cited by examiner

Primary Examiner—Jessica Han

(57) ABSTRACT

For use in a power converter having a power switch subject to switching losses and a rectifying diode subject to a reverse recovery condition, a snubber circuit and related method to mitigate adverse effects associated with the switching losses and the reverse recovery condition. In one embodiment, the snubber circuit includes a recovery circuit, having first and second energy storage devices and a snubber diode, coupled to the rectifying diode. The snubber circuit further includes a third energy storage device, coupled across the rectifying diode, configured to cooperate with the recovery circuit to mitigate adverse effects associated with the reverse recovery condition and reduce a rate of change of a voltage across the power switch to reduce the switching losses.

21 Claims, 4 Drawing Sheets

US 6,169,671 B1

SNUBBER CIRCUIT FOR A POWER SWITCH AND RECITIFYING DIODE AND POWER CONVERTER EMPLOYING THE SAME

TECHNICAL FIELD OF THE INVENTION

The present invention is directed, in general, to power conversion and, more specifically, to a snubber circuit for a power switch and rectifying diode and a power converter employing the same.

BACKGROUND OF THE INVENTION

A power converter is a power processing circuit that converts an input voltage or current waveform into a specified output voltage or current waveform. A switched-mode power converter is a frequently employed power converter that converts an input voltage into a specified output voltage. A boost power converter converts the input voltage to an output voltage that is greater than the input voltage. Typically, the boost power converter is employed in off-line applications wherein power factor correction is required and a stable regulated voltage is desired at the output of the power converter. For instance, boost power converters are employed in the telecommunications and computer industries as a segment of the power management system.

A non-isolated boost power converter generally includes an energy storage device (e.g., an inductor) coupled between the input voltage and a power switch. The power switch is then coupled to a rectifier (e.g., a rectifying diode) and an output capacitor. The load is connected in parallel to the capacitor. Again, the output voltage (measured at the load) of the boost power converter is always greater than the input voltage. When the power switch is conducting, the diode is reverse biased thereby isolating the output stage. During this period, the input voltage supplies energy to the inductor. When the power switch is not conducting, the output stage receives the energy stored in the inductor for delivery to the load coupled to the output of the converter.

Analogous to all types of power converters, a boost power converter is subject to inefficiencies that impair the overall performance thereof. More specifically, the rectifying diode suffers from a reverse recovery condition thereby producing excessive power losses in both the rectifying diode and the power switch and oscillations in both current and voltage therefrom. The effect of the reverse recovery condition is more severe in non-isolated converters, such as the boost power converter, due to the low impedance across the voltage source during the commutation of the rectifying diode. The reverse recovery condition can also detrimentally affect the longevity of the components, especially the rectifying diode and power switch, of the boost power converter.

Furthermore, the power switch [e.g., a metal-oxide semiconductor field-effect transistor (MOSFET)] is subject to losses when substantial voltage and current are simultaneously imposed on the power switch during the transition periods thereof. The losses associated with the power switch and rectifier increase linearly as the switching frequency of the boost power converter escalates. Therefore, efforts to minimize the losses associated with the boost power converter and, more specifically, the losses associated with the power switch and rectifier will improve the overall efficiency of the boost power converter.

A traditional manner to reduce the losses associated with the power switch and rectifying diode is to introduce a snubber circuit coupled thereto. Snubber circuits are generally employed for various functions including to minimize overcurrents and overvoltages across a device during conduction and non-conduction periods and to shape the device switching waveforms such that the voltage and current associated with the device are not concurrently high. For instance, with respect to rectifying diodes, a snubber circuit may be employed to minimize oscillations in both voltage and current and power losses associated therewith due to reverse recovery current resulting from a snap-off of the rectifying diode during a transition from a conduction to non-conduction mode of operation. In a more specific example, U.S. Pat. No. 5,923,547, ("the '547 patent") entitled "A Snubber Circuit for a Power Converter and Method of Operation Thereof," issued Jul. 13, 1999, to Hengchun Mao, commonly assigned with the present invention and incorporated herein by reference, discloses a snubber circuit that achieves a substantially zero current turn-off for the power switch of the converter and further reduces the reverse recovery currents of the rectifier over a wide range of power applications.

While the snubber circuit disclosed in the '547 patent and other related circuits specifically address the losses associated with the power switch and rectifier, there are other considerations that are germane to the overall performance of the power converter. As an example, lower voltage rectifying diodes are becoming more responsive and, depending on the design specifications, at times it makes sense to cascade a plurality of low-voltage rectifying diodes in the power converter. A limitation with the present snubber circuits is that such circuits do not account for voltage sharing between the plurality of rectifying diodes. Additionally, enhancing an overall efficiency associated with snubber circuits is always a continuing goal of circuit designers.

Accordingly, what is needed in the art is snubber circuit that improves the operation associated with the present snubber circuits and, in specific applications, can account for voltage sharing between a plurality of rectifying diodes in a power converter such as a boost power converter.

SUMMARY OF THE INVENTION

To address the above-discussed deficiencies of the prior art, the present invention provides for use in a power converter having a power switch subject to switching losses and a rectifying diode subject to a reverse recovery condition, a snubber circuit and related method to mitigate adverse effects associated with the switching losses and the reverse recovery condition. In one embodiment, the snubber circuit includes a recovery circuit, having first and second energy storage devices and a snubber diode, coupled to the rectifying diode. The snubber circuit further includes a third energy storage device, coupled across the rectifying diode, configured to cooperate with the recovery circuit to mitigate adverse effects associated with the reverse recovery condition and reduce a rate of change of a voltage across the power switch to reduce the switching losses.

The present invention introduces, in one aspect, the pervasive concept of using an energy storage device coupled across the rectifier of a power converter to enhance the advantages associated with the snubber circuit. The enhancement manifests itself in further reducing losses of the power converter and thereby increasing overall converter efficiency.

In one embodiment of the present invention, the power converter further includes a second rectifying diode series-coupled to the rectifying diode. The snubber circuit further includes a fourth energy storage device coupled across the second rectifying diode. In a related, but alternative embodiment, the snubber circuit further includes first and second damping resistors respectively coupled across the third and fourth energy storage devices. The energy storage devices provide enhance energy management during transition times and the damping resistors reduce ringing of the voltage waveforms.

In one embodiment of the present invention, the snubber circuit further includes a resistor series-coupled to the snubber diode and configured to enhance a current flow to the second energy storage device. In a related, but alternative embodiment, the snubber circuit further includes a second snubber diode coupled to the snubber diode and configured to facilitate reduction of energy losses experienced by the snubber diode and the resistor. These snubber diodes increase the effectiveness of the snubber circuit.

In one embodiment of the present invention, the power switch is selected from the group consisting of a metal oxide semiconductor field effect transistor and a bipolar junction transistor. Of course, the power switch may be selected from any current or future developed technology.

In one embodiment of the present invention, the power converter has a topology selected from the group consisting of a boost converter and a buck converter. The concepts of the present invention may be advantageously applied to other converter topologies as well.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
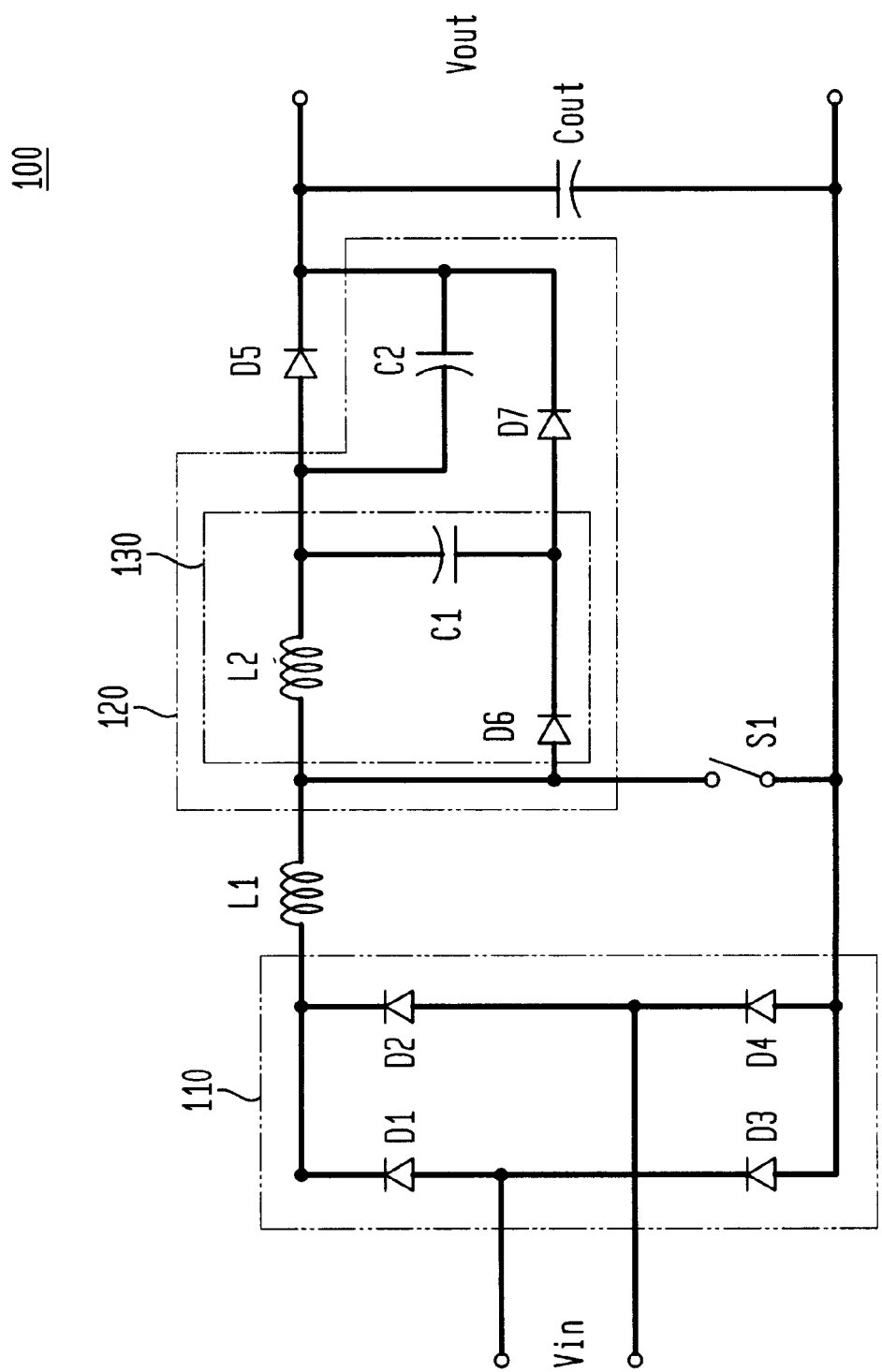
FIG. 1 illustrates a schematic diagram of an embodiment of a power converter constructed according to the principles of the present invention.

Referring initially to FIG. 1, illustrated is a schematic diagram of an embodiment of a power converter (a boost power converter) 100 constructed according to the principles of the present invention. The power converter 100, coupled to an input voltage Vin and providing an output voltage Vout, includes a full bridge rectifier 110 having first, second, third and fourth diodes D1, D2, D3, D4. The power converter 100 further includes a boost inductor L1, a power switch S1, a rectifying diode D5 and an output capacitor Cout.

The power converter 100 still further includes a snubber circuit 120 having a recovery circuit 130 that is coupled to the rectifying diode D5. The recovery circuit 130 includes a first energy storage device C1, a second energy storage device L2 and a first snubber diode D6. The snubber circuit 120 further includes a second snubber diode D7 and a third energy storage device C2 that is coupled across the rectifying diode D5. The third energy storage device C2 is configured to cooperate with the recovery circuit 130 to increase the energy of the first energy storage device C1 such that it may be higher than a reverse recovery energy of the rectifier diode D5. The transition of current from the first snubber diode D6 to the second energy storage device L2 may be enhanced after the power switch S1 is turned OFF. Additionally, the third energy storage device C2 cooperates to reduce a rate of change of a voltage across the power switch S1 and thereby reduce switching losses and electromagnetic interference (EMI) emissions associated with the power switch S1.

In the illustrated embodiment, the output voltage Vout equals 400 volts. The power switch S1 may typically be a metal oxide semiconductor field effect transistor (MOSFET) or a bipolar junction transistor. Of course, other switching devices may be employed as the application dictates. When the power switch S1 closes, the rectifying diode D5 is conducting, and the output voltage Vout of 400 volts is placed across the second energy storage device L2 and the current through the second energy storage device L2 begins to decrease. As the current through the second energy storage device L2 decreases, a point is reached where the current in the rectifying diode D5 reaches zero. At this point, the rectifying diode D5 continues to conduct in a reverse recovery mode until the stored charge in the rectifying diode D5 is completely removed. The first snubber diode D6 then starts to conduct and energy is transferred from the second energy storage device L2 to the first energy storage device C1. Additionally, the third energy storage device C2 increases the energy in the first energy storage device C1 so that enough energy may be obtained to assist in the turn-OFF transition of the power switch S1. The first snubber diode D6 stops conducting when its current resonates to substantially zero.

When the power switch S1 opens, the current flowing through the boost inductor L1 is initially directed through the first energy storage device C1, the third energy storage device C2 and the first snubber diode D6. At this time, the current through the second energy storage device L2 begins to increase because the voltage across the first energy storage device C1 is applied across the second energy storage device L2. The third energy storage device C2 reduces the rate of voltage change across the power switch S1 thereby reducing both its turn-off loss and its contribution to EMI. The second snubber diode D7 starts to conduct when the voltage across the third energy storage device C2 has discharged to a level substantially equal to the voltage across the first energy storage device C1. When the current through the second energy storage device L2 equals the current through the boost inductor L1, the first snubber diode D6 stops conducting and the voltage across the first energy storage device C1 continues to decrease. The rectifying diode D5 again conducts after the voltage across the first energy storage device C1 has discharged to substantially zero. Therefore, the third energy storage device C2 is seen to enhance the operation of the power switch S1 and the rectifying diode D5.

Figure 2:
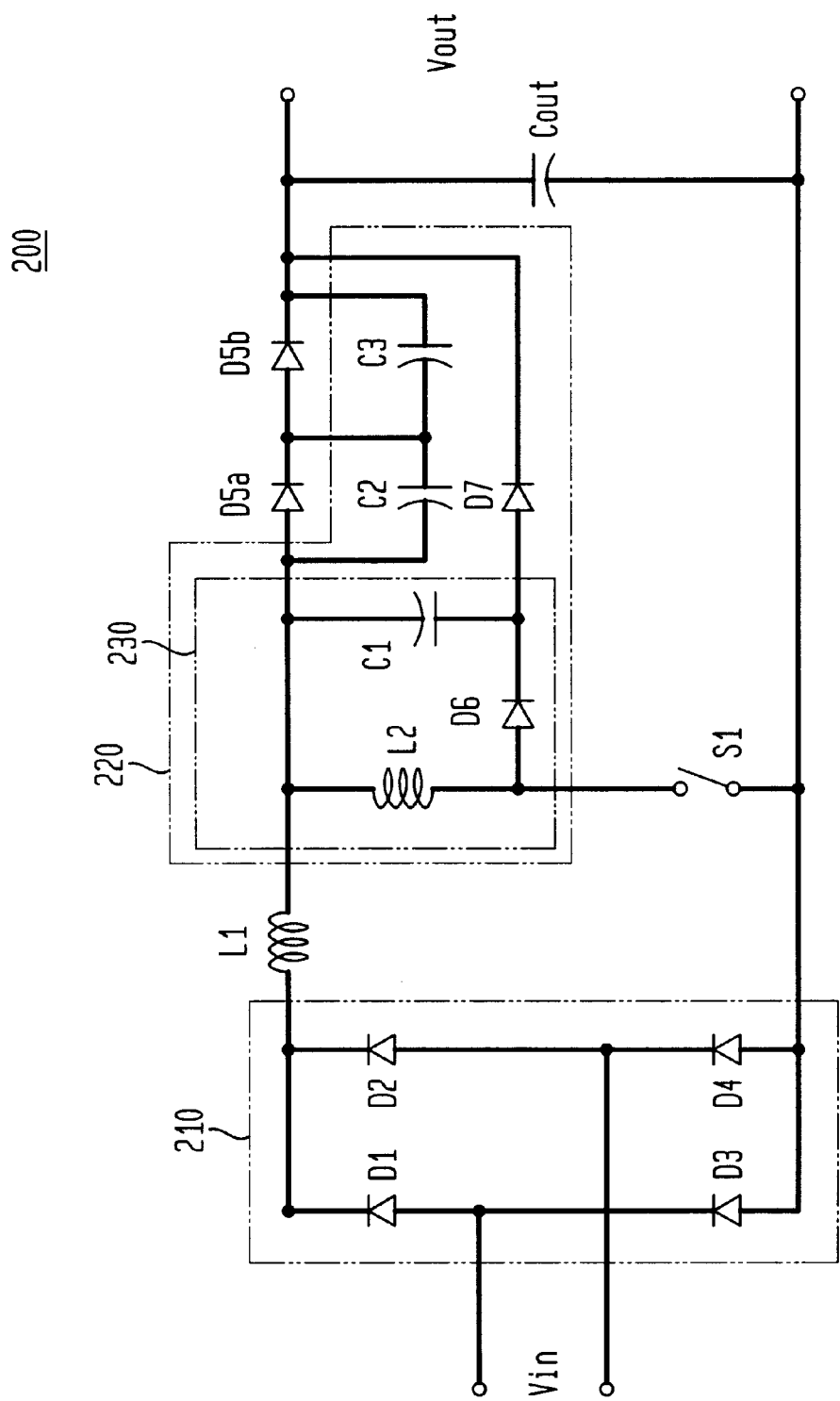
FIG. 2 illustrates a schematic diagram of another embodiment of a power converter constructed according to the principles of the present invention.

Turning now to FIG. 2, illustrated is a schematic diagram of another embodiment of a power converter (a boost power converter 200) constructed according to the principles of the present invention. The power converter 200, coupled to an input voltage Vin and providing an output voltage Vout, includes a full bridge rectifier 210 having first, second, third and fourth diodes D1, D2, D3, D4. The power converter 200 further includes a boost inductor L1, a power switch S1, first and second rectifying diodes D5a, D5b that are series-coupled and an output capacitor Cout.

The power converter 200 still further includes a snubber circuit 220 having a recovery circuit 230 that is coupled to the first and second rectifying diodes D5a, D5b. The recovery circuit 230 includes a first energy storage device C1, a second energy storage device L2 and a first snubber diode D6. The snubber circuit 220 further includes a second snubber diode D7 and third and fourth energy storage devices C2, C3 that are coupled across the first and second rectifying diodes D5a, D5b, respectively.

In the illustrated embodiment, the traditional use of a single rectifying diode has been replaced by a pair of series-coupled rectifying diodes, which offer several advantages. The required breakdown voltage of each of the series-coupled first and second rectifying diodes D5a, D5b is only about half of the value needed for a single rectifying diode. Of course, more than two series-coupled rectifying diodes may be employed as may be dictated in an alternative embodiment or application.

Typically, lower-breakdown voltage rectifying diodes also have faster reverse recovery characteristics thereby affording additional circuit advantages such as reduced size and power losses of the snubber circuit components. In the illustrated embodiment, use of the third and fourth energy storage devices C2, C3 offers the same advantages that were discussed in the embodiment of FIG. 1. These advantages include reduced reverse recovery loss for the first and second rectifying diodes D5a, D5b, and reduced turn-off loss for the power switch S1. Advantageously, the use of the third and fourth energy storage devices C2, C3 also tends to balance the voltages across the first and second rectifying diodes, respectively. In any transition, since the capacitance of the third and fourth energy storage devices C2, C3 are substantially the same and much higher than the parasitic capacitance of the first and second rectifying diodes D5a, D5b, the voltages across the first and second rectifying diodes D5a, D5b can be maintained substantially equal even if their switching speeds and junction capacitances are not the same.

Figure 3:
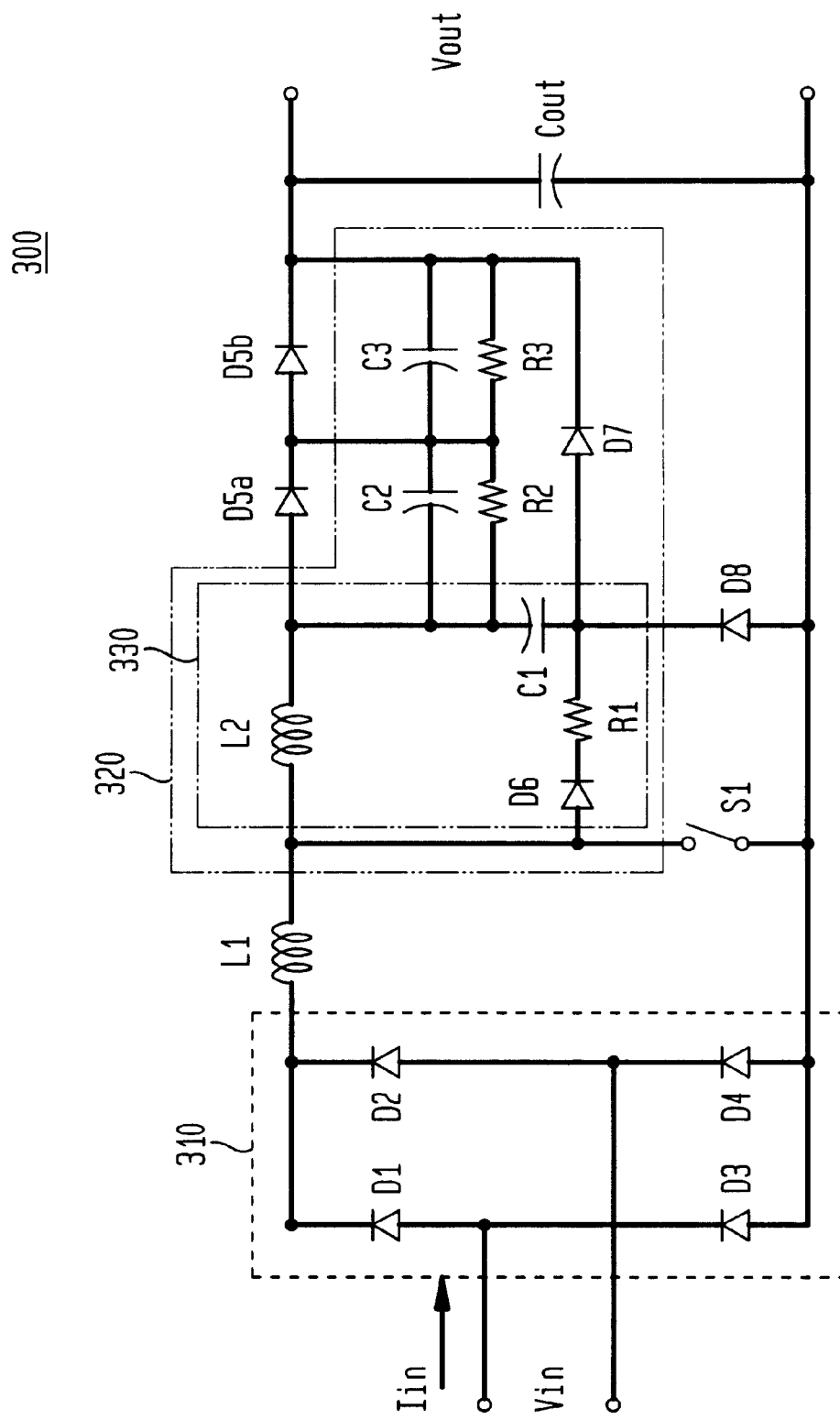
FIG. 3 illustrates a schematic diagram of yet another embodiment of a power converter constructed according to the principles of the present invention.

Turning now to FIG. 3, illustrated is a schematic diagram of yet another embodiment of a power converter (a boost power converter) 300 constructed according to the principles of the present invention. The power converter 300, coupled to an input voltage Vin and providing an output voltage Vout, includes a full bridge rectifier 310 having first, second, third and fourth diodes D1, D2, D3, D4. The power converter 300 further includes a boost inductor L1, a power switch S1, first and second rectifying diodes D5a, D5b that are series-coupled and an output capacitor Cout.

The power converter 300 still further includes a snubber circuit 320 having a recovery circuit 330 that is coupled to the first and second rectifying diodes D5a, D5b. The recovery circuit 330 includes a first energy storage device C1, a second energy storage device L2, a first snubber diode D6 and a resistor R1 that is series-coupled to the first snubber diode D6. The snubber circuit 320 further includes a second snubber diode D7, a third snubber diode D8 and third and fourth energy storage devices C2, C3 that are coupled across the first and second rectifying diodes D5a, D5b, respectively. The snubber circuit 320 still further includes first and second damping resistors R2, R3 that are coupled across the third and fourth energy storage devices C2, C3, respectively.

In the illustrated embodiment, the recovery circuit 330 is again positioned closer to the input of the power converter 300 and the resistor R1 has been included. The resistor R1 allows enhanced current transfer from the snubber circuit 320 to the first and second rectifying diodes D5a, D5b and damps possible oscillations after the turn-off of the first snubber diode D6. Additionally, the third snubber diode D8 reduces snubber losses. The first and second damping resistors R2, R3 reduce the effect of the reverse leakage currents in the first and second rectifying diodes D5a, D5b and provide static voltage sharing for additional equalization of the voltages across the first and second rectifying diodes D5a, D5b. The first and second damping resistors R2, R3 also reduce voltage ringing in the snubber circuit 320 thereby lowering reverse voltages across the first and second rectifying diodes D5a, D5b.

Figure 4:
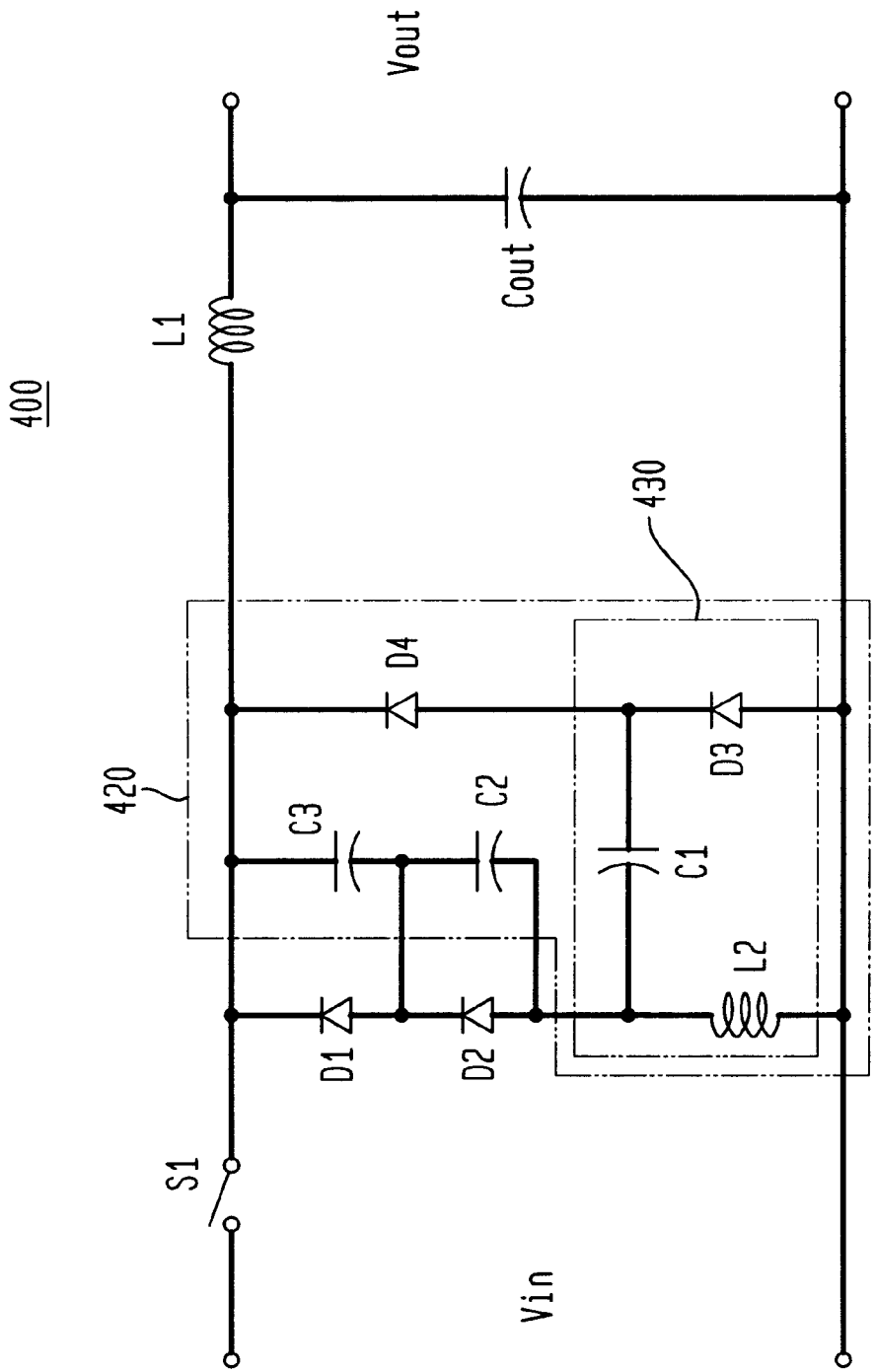
FIG. 4 illustrates a schematic diagram of still yet another embodiment of a power converter constructed according to the principles of the present invention.

Turning now to FIG. 4, illustrated is a schematic diagram of still another embodiment of a power converter (a buck power converter) 400 constructed according to the principles of the present invention. The power converter 400, coupled to an input voltage Vin and providing an output voltage Vout, includes a boost inductor L1, a power switch S1, first and second rectifying diodes D1, D2 and an output capacitor Cout.

The power converter 400 further includes a snubber circuit 420 having a recovery circuit 430 that is coupled to the first and second rectifying diodes D1, D2. The recovery circuit 430 includes a first energy storage device C1, a second energy storage device L2 and a first snubber diode D3. The snubber circuit 420 further includes a second snubber diode D4 and third and fourth energy storage devices C2, C3 that are coupled across the first and second rectifying diodes D1, D2, respectively.

The illustrated embodiment shows an application of the invention employing a buck power converter topology. As discussed in the previous boost power converter topologies, application of the third and fourth energy storage devices C2, C3 advantageously provides reduced reverse recovery loss for the first and second rectifying diodes D5a, D5b, and reduced turn-off loss for the power switch S1. Use of the third and fourth energy storage devices C2, C3 also tends to balance the voltages across the first and second rectifying diodes, respectively.

In summary, the present invention introduces, in one aspect, the pervasive concept of using an energy storage device coupled across the main rectifying structure (usually one or more diodes) of a power converter to enhance the operation of the snubber circuit. This enhancement manifests itself in further reducing losses of the power converter and thereby increasing overall converter efficiency. Although the principles of the present invention have been shown to apply to both boost and buck topologies, it is of course understood that the principles may be applied to other topologies as well.

Exemplary embodiments of the present invention have been illustrated above with reference to specific electronic components. Those skilled in the art are aware, however, that components may be substituted (not necessarily with components of the same type) to create desired conditions or accomplish desired results. For instance, multiple components may be substituted for a single component and vice-versa.

For a better understanding of power electronics, power converter topologies, such as the boost power converter, and snubber circuits, see: "Principles of Power Electronics," by J. Kassakian and M. Schlecht, Addison-Wesley Publishing Company (1991), "High Efficiency Telecom Rectifier Using a Novel Soft-Switching Boost-Based Input Current Shaper," by R. Streit, D. Tollik, IEEE Intelec Conference Records, pages 720–726 (1991), "Soft Transitions Power Factor Correction Circuit, by I. D. Jitaru, Proceedings of HFPC," pages 202–208 (1993), U.S. Pat. No. 5,307,004, entitled "Soft Switching Boost and Buck Regulators," issued on Apr. 26, 1994, to Bruce Carsten and U.S. Pat. No. 5,313,382, entitled "Reduced Voltage/Zero Current Transition Boost Power Converter," issued on May 17, 1994, to Richard Farrington. The aforementioned references are incorporated herein by reference.

Although the present invention has been described in detail, those skilled in the art should understand that they can make various changes, substitutions and alterations herein without departing from the spirit and scope of the invention in its broadest form.

What is claimed is:

1. For use in a power converter having a power switch subject to switching losses and a rectifying diode subject to a reverse recovery condition, a snubber circuit, comprising:
   a recovery circuit, including first and second energy storage devices and a snubber diode, coupled to said rectifying diode; and
   a third energy storage device, coupled across said rectifying diode, configured to cooperate with said recovery circuit to mitigate adverse effects associated with said reverse recovery condition and reduce a rate of change of a voltage across said power switch to reduce said switching losses.

2. The snubber circuit as recited in claim 1 wherein said power converter further comprises a second rectifying diode series-coupled to said rectifying diode, said snubber circuit further comprising a fourth energy storage device coupled across said second rectifying diode.

3. The snubber circuit as recited in claim 2 further comprising first and second damping resistors respectively coupled across said third and fourth energy storage devices.

4. The snubber circuit as recited in claim 1 further comprising a resistor series-coupled to said snubber diode and configured to enhance a current flow to said second energy storage device.

5. The snubber circuit as recited in claim 4 further comprising a second snubber diode coupled to said snubber diode and configured to facilitate reduction of energy losses experienced by said snubber diode and said resistor.

6. The snubber circuit as recited in claim 1 wherein said power switch is selected from the group consisting of:
   a metal oxide semiconductor field effect transistor; and
   a bipolar junction transistor.

7. The snubber circuit as recited in claim 1 wherein said power converter has a topology selected from the group consisting of:
   a boost converter; and
   a buck converter.

8. For use in a power converter having a power switch subject to switching losses and a rectifying diode subject to a reverse recovery condition, a method, comprising:
   mitigating adverse effects associated with said reverse recovery condition and reducing a rate of change of a voltage across said power switch to reduce said switching losses with a snubber circuit, including:
      a recovery circuit, including first and second energy storage devices and a snubber diode, coupled to said rectifying diode, and
      a third energy storage device coupled across said rectifying diode.

9. The method as recited in claim 8 wherein said power converter further comprises a second rectifying diode series-coupled to said rectifying diode, said snubber circuit further comprising a fourth energy storage device coupled across said second rectifying diode.

10. The method as recited in claim 9 further comprising facilitating voltage sharing between said rectifying diode and second rectifying diode.

11. The method as recited in claim 8 further comprising enhancing a current flow to said second energy storage device.

12. The method as recited in claim 8 further comprising facilitating reduction of energy losses experienced by said snubber diode.

13. The method as recited in claim 8 wherein said power switch is selected from the group consisting of:
   a metal oxide semiconductor field effect transistor; and
   a bipolar junction transistor.

14. The method as recited in claim 8 wherein said power converter has a topology selected from the group consisting of:
   a boost converter; and
   a buck converter.

15. A power converter having an input and an output, comprising:
   a power switch coupled to said input and subject to switching losses;
   a rectifying diode coupled to said power switch and subject to a reverse recovery condition;
   an output filter coupled across said output; and
   a snubber circuit, interposed between said rectifying diode and said output filter, including:
      a recovery circuit, including first and second energy storage devices and a snubber diode, coupled to said rectifying diode; and
      a third energy storage device, coupled across said rectifying diode, configured to cooperate with said recovery circuit to mitigate adverse effects associated with said reverse recovery condition and reduce a rate of change of a voltage across said power switch to reduce said switching losses.

16. The power converter as recited in claim 15 further comprising a second rectifying diode series-coupled to said rectifying diode, said snubber circuit further comprising a fourth energy storage device coupled across said second rectifying diode.

17. The power converter as recited in claim 16 wherein said snubber circuit further comprises first and second damping resistors respectively coupled across said third and fourth energy storage devices.

18. The power converter as recited in claim 15 wherein said snubber circuit further comprises a resistor series-coupled to said snubber diode and configured to enhance a current flow to said second energy storage device.

19. The power converter as recited in claim 18 wherein said snubber circuit further comprises a second snubber diode coupled to said snubber diode and configured to facilitate reduction of energy losses experienced by said snubber diode and said resistor.

20. The power converter as recited in claim 15 wherein said power switch is selected from the group consisting of:
   a metal oxide semiconductor field effect transistor; and
   a bipolar junction transistor.

21. The power converter as recited in claim 15 wherein said power converter has a topology selected from the group consisting of:
   a boost converter; and
   a buck converter.

* * * * *